United States Patent
Sun et al.

(10) Patent No.: US 8,249,530 B2
(45) Date of Patent: Aug. 21, 2012

(54) APPARATUS AND METHOD FOR POWER AMPLIFICATION IN WIRELESS COMMUNICATION SYSTEM

(75) Inventors: Kae-Oh Sun, Uiwang-si (KR);
Keun-Hyo Song, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 762 days.

(21) Appl. No.: 12/240,024

(22) Filed: Sep. 29, 2008

(65) Prior Publication Data

US 2009/0088096 A1 Apr. 2, 2009

(30) Foreign Application Priority Data

Oct. 2, 2007 (KR) .......................... 10-2007-0099381

(51) Int. Cl.
*H01Q 11/12* (2006.01)
(52) U.S. Cl. ........................... 455/127.1; 455/91; 330/10
(58) Field of Classification Search ................ 455/127.1
See application file for complete search history.

(56) References Cited

U.S. PATENT DOCUMENTS

| 5,691,668 | A | 11/1997 | Yoshikawa et al. |
| 5,877,653 | A | 3/1999 | Kim et al. |
| 6,081,156 | A | 6/2000 | Choi et al. |
| 2004/0266366 | A1* | 12/2004 | Robinson et al. ............... 455/91 |
| 2007/0018718 | A1* | 1/2007 | Horng et al. .................... 330/10 |

* cited by examiner

*Primary Examiner* — Duc Nguyen
*Assistant Examiner* — Ajibola Akinyemi
(74) *Attorney, Agent, or Firm* — Jefferson IP Law, LLP

(57) ABSTRACT

An apparatus and method for power amplification in a wireless communication system are provided. The apparatus includes an envelope generator for generating an envelope signal from a Radio Frequency (RF) signal, a switching controller for generating a first switching control signal by delta-sigma modulating the envelope signal, and for generating a second switching control signal by amplifying an error signal obtained from a difference between an envelope signal restored by filtering the modulated envelope signal and an original envelope signal and an amplifier for outputting a first output signal by amplifying a phase signal according to the first switching control signal, for outputting a second output signal by amplifying the phase signal according to the second switching control signal, and for combining the first output signal and the second output signal. Thus, high efficiency and high linearity can be accomplished in the power amplification.

20 Claims, 5 Drawing Sheets

APPARATUS AND METHOD FOR POWER AMPLIFICATION IN WIRELESS COMMUNICATION SYSTEM

PRIORITY

This application claims the benefit under 35 U.S.C. §119 (a) to a Korean patent application filed in the Korean Intellectual Property Office on Oct. 2, 2007 and assigned Serial No. 2007-99381, the entire disclosure of which is hereby incorporated by reference.

BACKGROUND OF THE INVENTION

1. Field of the Invention

The present invention relates to an apparatus and a method for amplifying power in a wireless communication system. More particularly, the present invention relates to an apparatus and a method for a power amplification of high efficiency and high linearity using an error amplifier.

2. Description of the Related Art

In a wireless communication system, a Power Amplifier (PA) is a very important component. The PA must satisfy various different criteria such as operating at high efficiency, supporting a broad band signal and providing high power, all while maintaining a reasonable cost. Hence, a great deal of research is being conducted to develop such a PA. However, it is not easy to satisfy all of the requirements of high efficiency, broad band support and high power. Recently, an Envelope Tracking (ET) technique and an Envelope Elimination and Restoring (EER) technique, which are more efficient than a conventional Linear amplification using Nonlinear Components (LINC) technique or a Doherty technique, are being adopted.

FIG. 1 illustrates a conventional PA in the EER structure.

Referring to FIG. 1, an input Radio Frequency (RF) signal is split into an amplitude component and a phase component and is then amplified. After the input RF signal is split, an amplitude detector 100 detects the amplitude component from the RF signal and outputs an envelope signal. Similarly, a phase detector 102 detects the phase component from the RF signal and outputs a phase signal. An envelope amplifier 104 amplifies the envelope signal fed from the amplitude detector 100 and outputs the amplified envelope signal to a switching mode PA 106. That is, a drain bias of the switching mode PA 106 for amplifying the phase signal is supplied from the envelope amplifier 104. Hence, when the PA 106 operates in a saturation mode, the envelope of the output signal from the PA 106 is controlled by the output waveform of the envelope amplifier 104.

In general, the envelope amplifier 104 includes a high-efficiency switching amplifier and a broadband voltage amplifier. Since 80~85% of the envelope signal power of an Orthogonal Frequency Division Multiplexing (OFDM) signal ranges in a low frequency (below 1 MHz), the efficiency of the switching amplifier considerably affects the efficiency of the entire system. The switching amplifier can acquire an efficiency of over 80% by employing a Class-S amplifier similar to a DC-DC buck converter. However, the broadband characteristic, which is obtained from the PA, deteriorates for an input signal of a high Peak to Average Power Ratio (PAPR). This is a decisive factor on the efficiency of the entire system as well.

In the power amplification of the EER structure, the overall efficiency is determined by multiplying the efficiency of the envelope amplifier 104 by the efficiency of the PA 106. Since the efficiency of the PA 106 cannot be optimized for every drain voltage, the design seeks to provide the highest efficiency around the average power. Accordingly, the average efficiency of the PA 106 does not reach the maximum efficiency. Furthermore, this EER structure has many shortcomings in view of linearity, particularly in the low envelope voltage. Thus, the PA of the EER structure should be used together with a Digital Pre-Distortion (DPD) technique. An EER structure using Delta Sigma Modulation (DSM), which is advantageous in terms of the efficiency and the linearity, is explained with reference to FIG. 2.

FIG. 2 illustrates a conventional PA transmitter having an EER structure using DSM.

Referring to FIG. 2, A Field-Programmable Gate Array (FPGA) 200 separates an envelope signal and a phase signal from an RF signal.

A delta-sigma modulator 210 delta-modulates the envelope signal output from the FPGA 200 to a digital signal. In more detail, the delta-sigma modulator 210 approximately predicts a value of the envelope signal, computes an error, and corrects the error using the accumulated error. The output signal quantized at a quantizer 214 is fed back to make a difference from the envelope signal in step 215. The output signal integrated at an integrator 212 is fed back and accumulated in step 216. By continually integrating the difference between the input signal and the feedback signal at the integrator 212, the signals themselves are integrated in the end. Its result is quantized through the quantizer 214.

A switch 230 performs a switching operation using the constant envelope signal quantized at the delta-sigma modulator 210 and supplies the drain voltage of a switching mode PA 240.

The switching mode PA 240 amplifies the phase signal output from the FPGA 200 using the switching control signal fed from the switch 230.

With respect to the signal output from the switching mode PA 240, a Band-Pass Filter (BPF) 250 passes signals in a specific frequency range and rejects signals outside the range.

Since the output signal of the delta-sigma modulator 210 has a constant envelope, the switching mode PA 240 can be designed to exhibit maximum efficiency. The switching mode PA 240 is switched on and off by the output signal from the delta-sigma modulator 210. Accordingly, the switching mode PA 240 is designed to produce voltage of the highest efficiency during the switch-on. However, while this design is advantageous in terms of the efficiency, it is difficult to extend the bandwidth because of the slow switching speed at high power.

As discussed above, the PA transmitter having the general EER structure additionally requires a compensation scheme such as DPD, because of concerns with linearity, and suffers limitations in enhancing the efficiency when the PAPR is high. However, in the EER structure based on the DSM, which mends the drawbacks of the general EER structure, it is difficult to extend the bandwidth because of the switching frequency limitation of the element. As a result, quantization noise is increased.

SUMMARY OF THE INVENTION

An aspect of the present invention is to address at least the above mentioned problems and/or disadvantages and to provide at least the advantages described below. Accordingly, an aspect of the present invention is to provide an apparatus and a method for amplifying power to compensate for quantization noise caused by a switching frequency limitation in a wireless communication system.

In accordance with an aspect of the present invention, an apparatus for amplifying power in a wireless communication system is provided. The apparatus includes an envelope generator for generating an envelope signal from a Radio Frequency (RF) signal, a switching controller for generating a first switching control signal by delta-sigma modulating the envelope signal, and for generating a second switching control signal by amplifying an error signal obtained from a difference between an envelope signal restored by filtering the modulated envelope signal and an original envelope signal and an amplifier for outputting a first output signal by amplifying a phase signal according to the first switching control signal, for outputting a second output signal by amplifying the phase signal according to the second switching control signal, and for combining the first output signal and the second output signal.

In accordance with another aspect of the present invention, a method for amplifying power in a wireless communication system is provided. The method includes generating an envelope signal from an RF signal, generating a first switching control signal by delta-sigma modulating the envelope signal, and generating a second switching control signal by amplifying an error signal obtained from a difference between an envelope signal restored by filtering the modulated envelope signal and an original envelope signal, outputting a first output signal by amplifying a phase signal according to the first switching control signal, outputting a second output signal by amplifying the phase signal according to the second switching control signal, and combining the first output signal and the second output signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments the present invention will become more apparent from the following detailed description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Exemplary embodiments of the present invention provide an apparatus and a method for amplifying power with high efficiency and high linearity in an Envelope Elimination and Restoration (EER) structure using a Delta-Sigma Modulation (DSM) in a wireless communication system.

Figure 3:
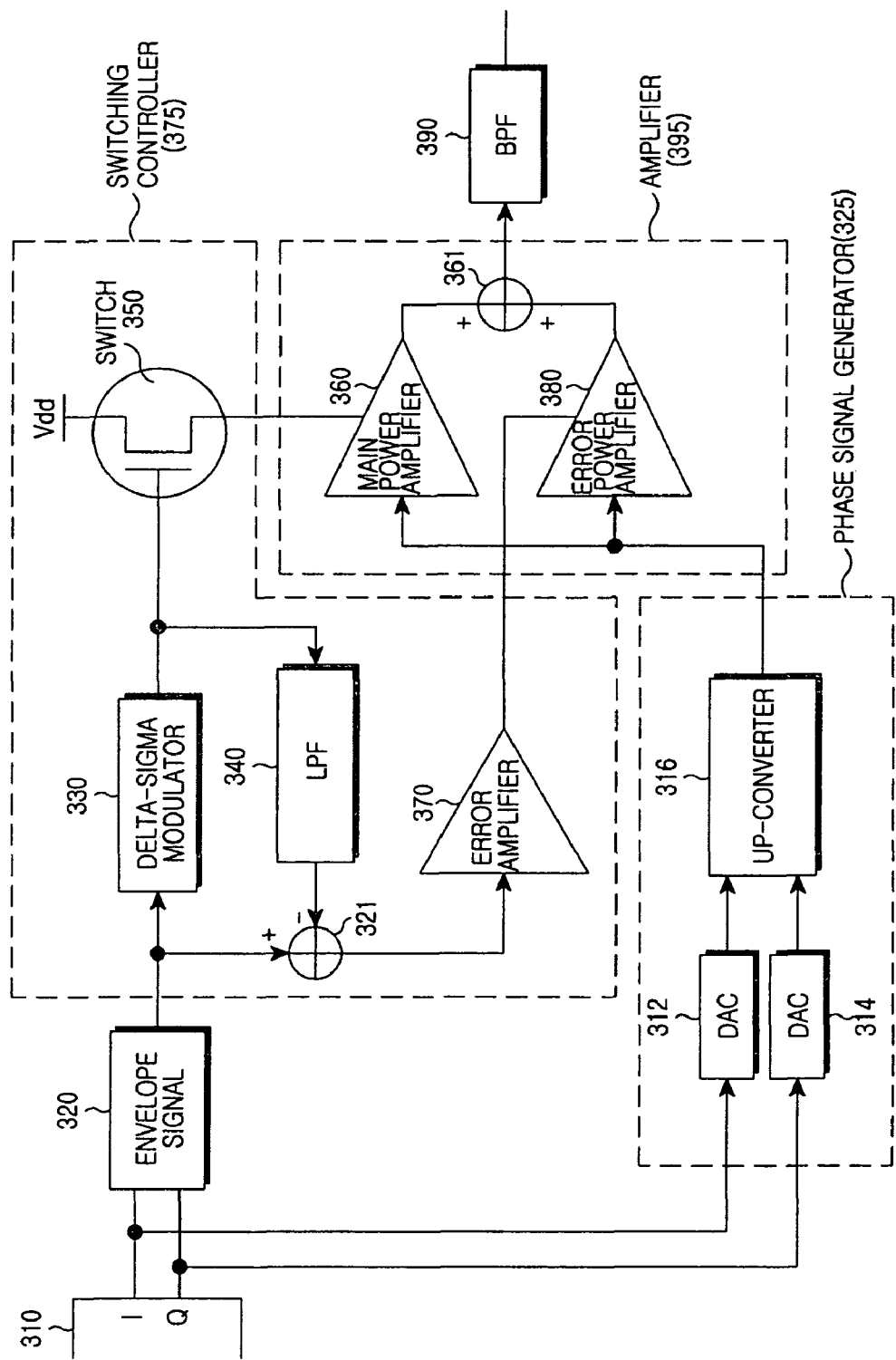
FIG. 3 illustrates an apparatus for amplifying power in an EER structure using a DSM according to an exemplary embodiment of the present invention.

FIG. 3 illustrates an apparatus for amplifying power in an EER structure using a DSM according to an exemplary embodiment of the present invention.

The power amplifying apparatus of FIG. 3 includes an envelope generator 320, a phase signal generator 325, a switching controller 375, an amplifier 395 and a Band-Pass Filter (BPF) 390. The switching controller 375 includes a delta-sigma modulator 330, a Low-Pass Filter (LPF) 340, a switch 350, a first signal combiner 321 and an error amplifier 370. The amplifier 395 includes a main power amplifier 360, an error power amplifier 380 and a second signal combiner 361. The phase signal generator 325 includes Digital-to-Analog Converters (DACs) 312 and 314 and an up-converter 316. In an exemplary implementation, the delta-sigma modulator 330 and the LPF 340 can be implemented using software.

The envelope generator 320 receives signals from an I/Q modulator 310, computes an envelope from square roots of the amplitude component and the phase component and outputs the envelope signal to the switching controller 375. The phase signal generator 325 receives signals from the I/Q modulator 310, converts the signals to analog signals through the DAC converters 312 and 314, up-converts the analog signals through the up-converter 316 and thus generates a phase signal. At this time, the envelope of the phase signal is constant.

The switching controller 375 generates a first switching control signal by a Delta Sigma Modulation (DSM) in the envelope signal, generates a second switching control signal by amplifying a difference (error signal) between a signal demodulated by filtering the modulated envelope signal and the envelope signal, and outputs the generated control signals to the amplifier 395. More specifically, the delta-sigma modulator 330 converts the envelope signal to a digital signal through DSM. The switch 350 generates an on-off switching control signal (hereafter, referred to as a first switching control signal) according to the modulated envelope signal output from the delta-sigma modulator 330 and outputs the generated control signal to the main power amplifier 360. The LPF 340 filters and restores only the low frequency range of the modulated envelope signal. The first signal combiner 321 outputs the error signal by calculating the difference between the demodulated envelope signal output from the LPF 340 and the envelope signal output from the envelope generator 320. The error amplifier 370 generates a switching control signal (hereafter, referred to as a second switching control signal) by amplifying the error signal output from the first signal combiner 321, and outputs the generated control signal to the error power amplifier 380.

The DSM process necessarily includes quantization noise when converting the analog data to digital data. That is, although DSM cancels most of the quantization noise, there still exists some error. Particularly, the limitation in switching frequency can increase more than the quantization noise.

The quantization noise is influenced mostly by a sampling rate. Signal to Noise Ratios (SNRs) for the first-order DSM and the second-order DSM are expressed in Equation (1) and Equation (2) respectively.

$$SNR_{1st} = 6.02N + 1.76 - 5.17 + 30\log(OSR) \quad (1)$$

$$SNR_{2nd} = 6.02N + 1.76 - 12.9 + 50\log(OSR) \quad (2)$$

In equations 1 and 2, N denotes the number of quantization bits and OSR denotes an over sampling rate. For example, for 1-bit DSM and oversampling by 10 times in a second order DSM, the variables in Equation (2) have values of N=1 and OSR=10. As a result, SNR is about 49 dB.

Figure 5:
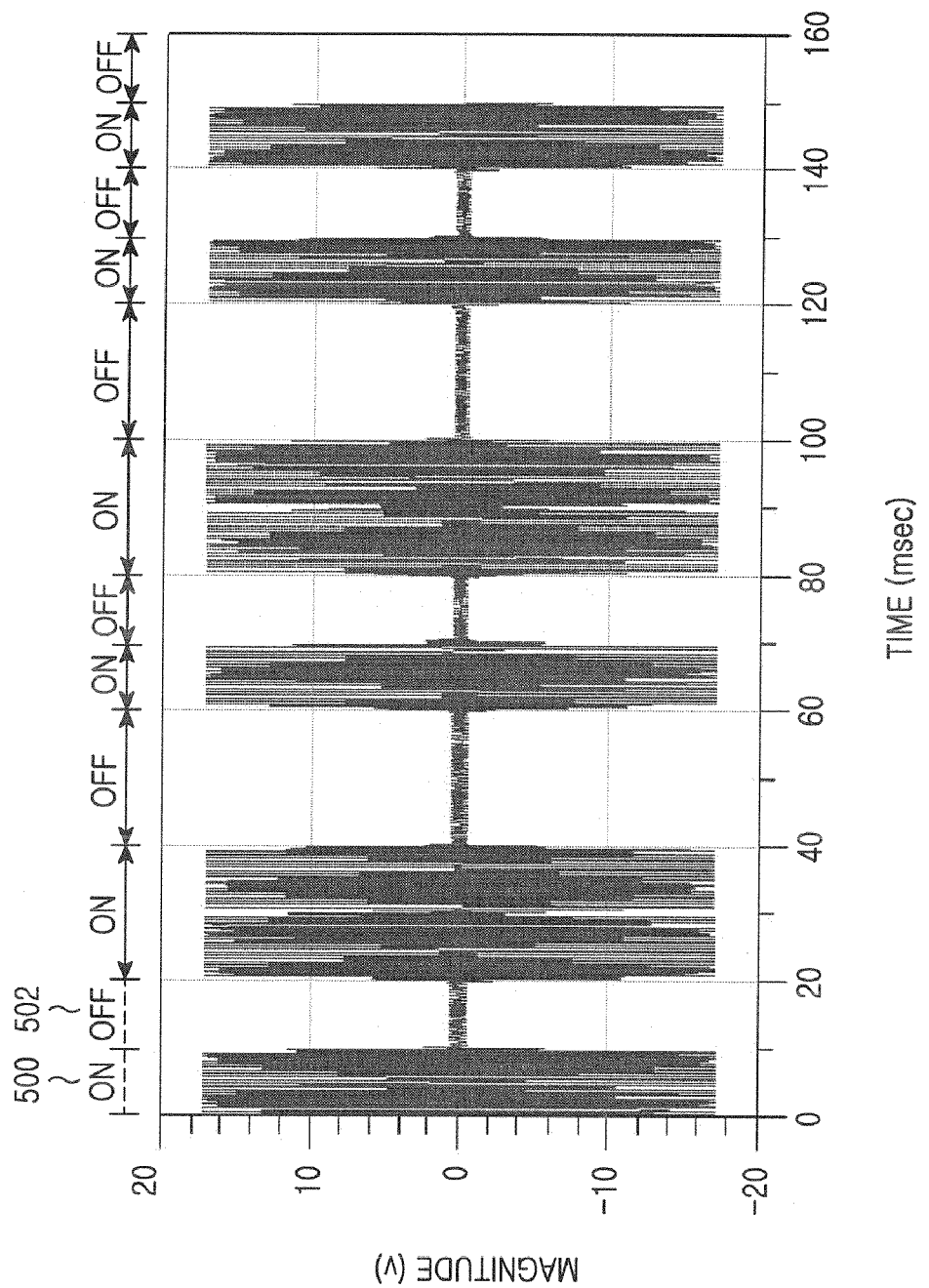
FIG. 5 illustrates an output signal of a main power amplifier according to an exemplary embodiment of the present invention.

The main power amplifier 360 generates a first output signal by amplifying the phase signal fed from the phase signal generator 325 according to the first switching control signal. The error power amplifier 380 generates a second output signal by amplifying the phase signal fed from the phase signal generator 325 according to the second switching control signal received from the error amplifier 370. Next, the first output signal and the second output signal are combined together in the second signal combiner 361. More specifically, the main power amplifier 360 receives the first switching control signal from the switching controller 375, amplifies the phase signal output from the phase signal generator 325, and switches on and off the signal as indicated by 500 and 502 in FIG. 5. The error power amplifier 380 receives the second switching control signal from the switching controller 375 and amplifies the phase signal output from the phase signal generator 325. The second signal combiner 361 combines the signal output from the main power amplifier 360 with the signal output from the error power amplifier 380.

Typically, as output power increases, the operating speed of a switching transistor decreases. Also, the switching loss increases with higher-speed operation. To avoid this, it is necessary to set an appropriate switching operating speed. As the sampling frequency gets higher, the capacity of the error amplifier 370 can decrease and the overall efficiency can increase.

Figure 1:
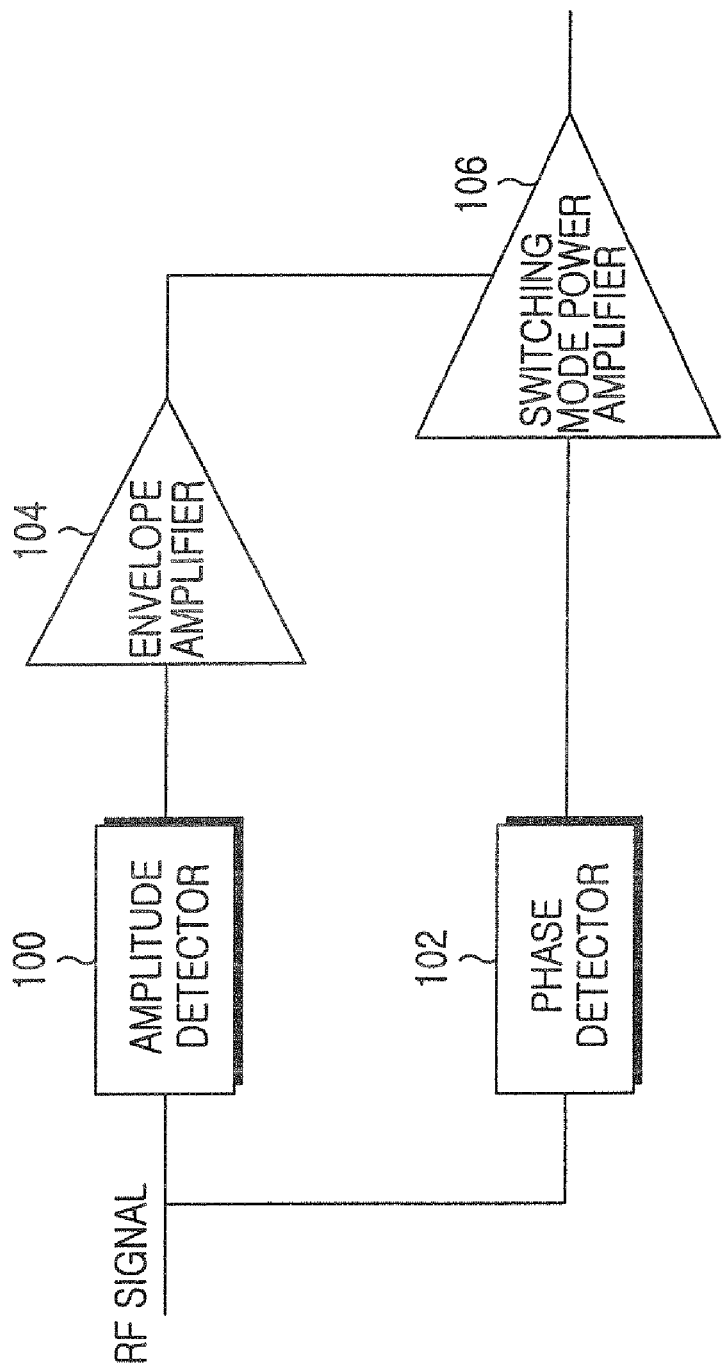
FIG. 1 illustrates a conventional Power Amplifier (PA) of an Envelope Elimination and Restoring (EER) structure.
Figure 2:
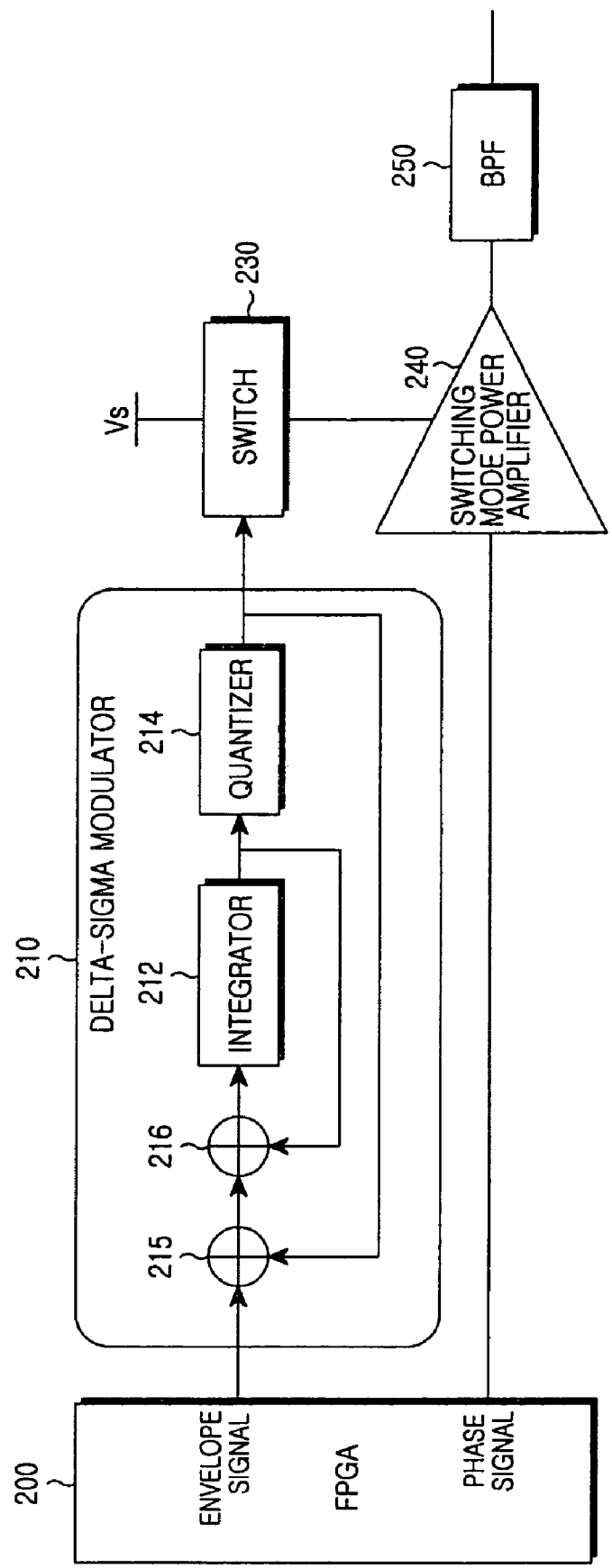
FIG. 2 illustrates a conventional PA of an EER structure using a Delta Sigma Modulation (DSM)

Compared to the conventional structure, the exemplary power amplifier structure of the present invention largely includes the narrow-band and high-power main power amplifier 360 controlled by the delta-sigma modulator 330, and the broadband and low-power error power amplifier 380 controlled by the error amplifier 370. The two power amplifiers can be implemented with switching amplifiers such as class-D, E or F amplifiers. In the structures of FIG. 1 and FIG. 2, the phase signal having the constant envelope is fed to the power amplifier, and the envelope signal is applied to the drain of the power amplifier to modulate the amplitude of the phase signal. In this exemplary embodiment of the present invention, the separate error amplifier 370 is additionally provided to ensure the linearity.

The BPF 390 filters the output signal from the amplifier by passing signals within a specific frequency range and rejecting signals outside the range.

As such, the output of the delta-sigma modulator 330 can be demodulated to the original envelope signal through the LPF 340. The demodulated envelope signal includes the quantization noise. Accordingly, the error signal acquired from the difference between the original envelope signal and the demodulated envelope signal is amplified by the error amplifier 370. The output of the error amplifier 370 is applied to the drain of the error power amplifier 380 which is another switching mode amplifier. Ultimately, the RF output signals from the main power amplifier 360 and the error power amplifier 380 are combined at the second signal combiner 361 and pass through the BPF 390. Thus, the intended RF signal is obtained. Compared to the conventional DSM, the quantization noise is compensated by using the error amplifier 370 even in the low switching speed. Thus, the linearity problem can be addressed. In addition, by amplifying only the error signal, the variation of the signal can be decreased to thus enhance the efficiency of the error power amplifier as well.

Figure 4:
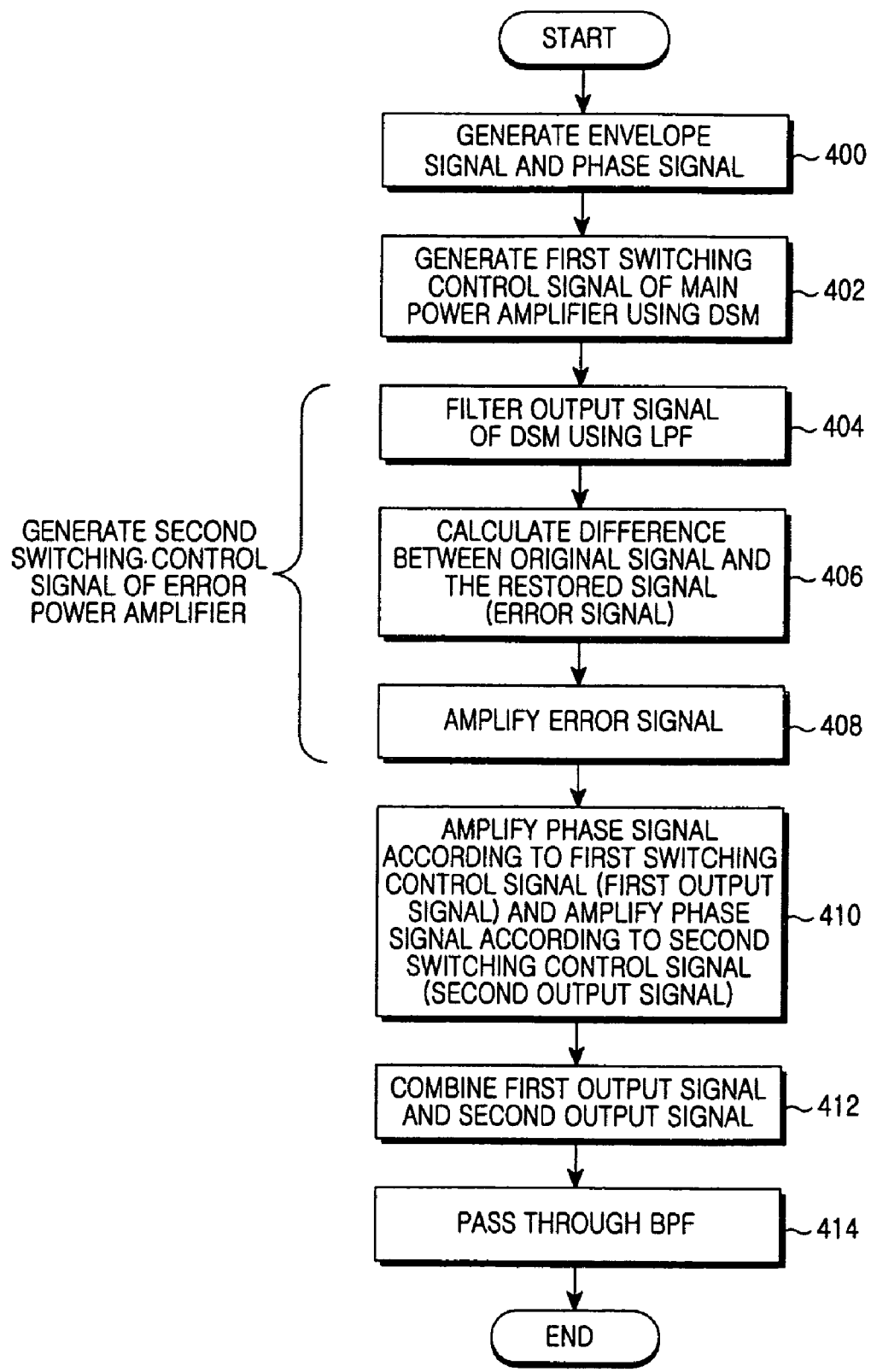
FIG. 4 illustrates a method for amplifying power in an EER structure using a DSM according to an exemplary embodiment of the present invention.

FIG. 4 illustrates a method for amplifying power in an EER structure using a DSM according to an exemplary embodiment of the present invention.

In step 400, the power amplifying apparatus receives the signal from the I/Q modulator 310, generates the envelope signal by computing the envelope based on the square roots of the amplitude component and the phase component and generates the phase signal through the DAC and the up-converter.

In step 402, the power amplifying apparatus generates the first switching control signal by DSM in the envelope signal.

In step 404, the power amplifying apparatus filters only the low frequency range of the modulated envelope signal and demodulates the signal.

In step 406, the power amplifying apparatus outputs the error signal by calculating the difference between the demodulated envelope signal and the original envelope signal.

In step 408, the power amplifying apparatus generates the second switching control signal by amplifying the error signal obtained from the difference between the demodulated envelope signal and the original envelope signal.

The second switching control signal of the error power amplifier is generated in steps 404 through 408.

In step 410, the power amplifying apparatus generates the first output signal by amplifying the phase signal according to the first switching control signal, and generates the second output signal by amplifying the phase signal according to the second switching control signal.

In step 412, the power amplifying apparatus combines the first output signal and the second output signal. In step 414, the power amplifying apparatus outputs the intended RF signal by filtering the combined output signal through the BPF.

Next, the power amplifying apparatus finishes this process.

As set forth above, as the error amplifier compensates for the quantization error in a wireless communication system, power amplification having high efficiency and high linearity can be achieved. As the power amplifier is of importance in a wireless communication system, the high-efficiency amplifier can reduce costs, reduce the overall system size based on the decreased size of a radiating plate, and increase stability according to the diminished heat.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for amplifying power in a wireless communication system, the apparatus comprising:
    an envelope generator for generating an envelope signal from a Radio Frequency (RF) signal;
    a switching controller for generating a first switching control signal by delta-sigma modulating the envelope signal, and for generating a second switching control signal by amplifying an error signal obtained from a difference between a demodulated envelope signal, which is obtained by filtering the modulated envelope signal, and an original envelope signal; and an amplifier for outputting a first output signal by amplifying a phase signal according to the first switching control signal, for outputting a second output signal by amplifying the phase signal according to the second switching control signal and for combining the first output signal and the second output signal.

2. The apparatus of claim 1, further comprising:
a Band-Pass Filter (BPF) for filtering an output of the amplifier.

3. The apparatus of claim 1, further comprising:
a phase signal generator for splitting the phase signal from the RF signal.

4. The apparatus of claim 3, wherein the phase signal comprises a constant envelope.

5. The apparatus of claim 3, wherein the phase signal generator comprises:
a Digital-to-Analog Converter (DAC) for converting a digital signal to an analog signal having a first frequency; and
an up-converter for receiving the analog signal at the first frequency and for outputting the analog signal at a second frequency that is higher than the first frequency.

6. The apparatus of claim 1, wherein the switching controller comprises:
a delta-sigma modulator for Delta-Sigma (DS)-modulating the envelope signal;
a switch for switching according to the DS modulated envelope signal;
a Low-Pass Filter (LPF) for filtering and demodulating the DS modulated envelope signal;
a signal combiner for generating an error signal by calculating a difference between the demodulated envelope signal and the original envelope signal; and
an error amplifier for amplifying the error signal.

7. The apparatus of claim 6, wherein the error amplifier provides the amplified error signal to an error power amplifier to compensate for quantization noise.

8. The apparatus of claim 1, wherein the amplifier comprises:
a main power amplifier for amplifying the phase signal according to the first switching control signal;
an error power amplifier for amplifying the phase signal according to the second switching control signal; and
a signal combiner for combining outputs of the main power amplifier and the error power amplifier.

9. The apparatus of claim 8, wherein each of the main power amplifier and the error power amplifier comprises a switching mode power amplifier.

10. The apparatus of claim 8, wherein the main power amplifier outputs a first band and a first power and the error amplifier outputs a second band and a second power, wherein the first band is narrower than the second band and the first power is greater than the second power.

11. A method for amplifying a power in a wireless communication system, the method comprising:
generating an envelope signal from a Radio Frequency (RF) signal;
generating a first switching control signal by delta-sigma modulating the envelope signal;
generating a second switching control signal by amplifying an error signal obtained from a difference between a demodulated envelope signal, which is obtained by filtering the modulated envelope signal, and an original envelope signal;
outputting a first output signal by amplifying a phase signal according to the first switching control signal;
outputting a second output signal by amplifying the phase signal according to the second switching control signal; and
combining the first output signal and the second output signal.

12. The method of claim 11, further comprising:
filtering the combined signal using a Band-Pass Filter (BPF).

13. The method of claim 11, further comprising:
splitting the phase signal from the RF signal.

14. The method of claim 13, wherein the phase signal comprises a constant envelope.

15. The method of claim 13, wherein the splitting of the phase signal from the RF signal comprises:
converting a digital signal to an analog signal having a first frequency; and
upconverting the analog signal to a second frequency, wherein the second frequency is higher than the first frequency.

16. The method of claim 11, wherein the generating of the first switching control signal and the second switching control signal comprises:
Delta-Sigma (DS)-modulating the envelope signal;
switching according to the DS-modulated envelope signal;
filtering and demodulating the DS-modulated envelope signal;
generating an error signal by calculating a difference between the demodulated envelope signal and the original envelope signal; and
amplifying the error signal.

17. The method of claim 16, further comprising providing the amplified error signal to an error power amplifier to compensate for quantization noise.

18. The method of claim 11, wherein the outputting and combining of the first output signal and the second signal comprises:
amplifying the phase signal according to the first switching control signal at a main power amplifier;
amplifying the phase signal according to the second switching control signal at an error power amplifier; and
combining outputs of the main power amplifier and the error power amplifier.

19. The method of claim 18, wherein each of the main power amplifier and the error power amplifier comprises a switching mode power amplifier.

20. The method of claim 18, wherein the main power amplifier outputs a first band and a first power, the error amplifier outputs a second band and a second power, the first band is narrower than the second band and the first power is greater than the second power.

* * * * *